Nov. 24, 1970 R. H. CUSHMAN 3,541,673

METHOD OF FORMING FILLET-SHAPED BONDS

Filed March 14, 1968 2 Sheets-Sheet 1

INVENTOR
R.H. CUSHMAN

By W. L. Williamson
ATTORNEY

METHOD OF FORMING FILLET-SHAPED BONDS

Filed March 14, 1968 2 Sheets-Sheet 2

United States Patent Office 3,541,673
Patented Nov. 24, 1970

3,541,673
METHOD OF FORMING FILLET-SHAPED BONDS

Robert Holbrook Cushman, Princeton Junction, N.J., assignor to Western Electric Company, Incorporated, New York, N.Y., a corporation of New York Filed Mar. 14, 1968, Ser. No. 713,012
Int. Cl. B23k 5/22, 31/02
U.S. Cl. 29—491 8 Claims

ABSTRACT OF THE DISCLOSURE

A fillet-shaped bond is formed between two elements by sandwiching a first element and a heat softenable bonding material between a deformable, resilient pad and a second element. Heat and pressure are applied to the sandwich to (1) force the elements against the pad to depress same, and (2) to render the bonding material fluent. The pad, in resisting deformation, forces the bonding material to collect in a fillet-shaped mass at the juncture of the two elements. The bonding material is then rigidified by cooling to effectuate the bond.

BACKGROUND OF THE INVENTION

This invention relates to a method of bonding and, more particularly, to a method of forming electrically conductive, fillet-shaped bonds.

In the farbrication of many electrical devices, such as semiconductor devices, printed circuit panels and the like, it is often necessary to bond one or more conductive leads to an electrically conductive terminal or lug. Typically, such bonds are formed by hand soldering techniques or by other plural-step techniques which necessitate accurately positioning the elements to be bonded, feeding a measured quantity of a conductive bonding material, liquefying the material, and properly distributing the material over the bond or connection sites. However, regardless of the particular technique employed, it must be such as to assure the formation of mechanically strong and durable bonds affording dependable electrical connections.

Generally speaking, bonding techniques involving the use of solder often require elaborate means for properly controlling the quantity of solder being fed to a prospective bond site and the distribution thereof. Additionally, solder bonding techniques often require a particular orientation of the elements being bonded with respect to the bonding means employed, are rather flexible as to the number of elements that can be bonded simultaneously and, are often limited in their application to bonding elements having a particular size or shape. It will be appreciated that the inability of conventional solder bonding techniques to adequately control the feeding and distribution of solder has rendered them uneconomically inefficient and, has often resulted in the formation of generally unreliable soldered connections. Additionally, the requisite of accurately aligning elements to be bonded with respect to a bonding means employed, seriously limits the rate at which bonds may be formed and tends to magnify the inefficiency of these techniques.

In an attempt to avoid the problems accompanying the feeding, liquefaction and distribution of various bonding materials, techniques employing precoated elements were developed. Generally speaking, these techniques employ elements having a low melting metal or alloy (i. e., solder), or some other heat softenable conductive material coated thereon so as to avoid the need for feeding a bonding material to prospective bond sits from a remote source. Although these techniques have reduced the need for independently feeding a measured quantity of bonding material, have reduced the quantity of material required to effect a bond and, have minimized the difficulties inherent with wetting elements to be bonded, they are generally incapable of forming mechanically strong bonds without the aid of rather inflexible means for accurately orienting the elements being bonded with respect to the bonding means employed. Additionally, conventional precoated element bonding techniques are generally incapable of forming acceptable bonds between elements having complex or intricate configurations since it is very difficult to properly align such element with respect to themselves and with respect to the bonding means being employed.

Accordingly, it is desirable to bond at least two elements together by a simple, economical and reliable technique that will eliminate the problems attending the accurate feeding and distribution of a bonding material, that will eliminate the need for carefully and accurately orienting the elements being bonded with respect to the bonding means being employed and, that will enable facile bonding of intricately shaped elements.

SUMMARY OF THE INVENTION

In accordance with the present invention, a first element is bonded to a second element by sandwiching the first element and a bonding material having a fluent state and a rigid state between a deformable, resilient pad and the second element. The sandwiched elements, bonding material and pad are then pressed together, preferably while the bonding material is in its rigid state, to depress the pad in conformance with the surfaces of the elements and the bonding material in pressure engagement therewith. The bonding material is then transformed into its fluent state (unless the bonding material was initially in its fluent state), whereupon the pad, in resisting deformation, forces the fluent bonding material toward the juncture of the first and second elements. The bonding material is then transformed into its rigid state to effectuate a bond between the elements.

BRIEF DESCRIPTION OF THE DRAWINGS

The invention will be more fully understood by reference to the following detailed description of specific embodiments thereof taken in conjunction with the drawing wherein.

DETAILED DESCRIPTION

Although the present invention may be employed for bonding or joining a wide variety of elements, it has particular utility in the formation of electrically conductive bonds between elements of an electrical circuit or electrical device. For example, the present invention is particularly useful for bonding conductive leads to electrical terminals and, accordingly, the invention will be herein described in detail, primarily, in connection with such application.

The details of the deformable, resilient pad 11, as illustrated in FIGS. 1 through 10, will now be discussed preparatory to a discussion of the method of this invention. The pad 11, which in this illustrative embodiment may comprise a silicone rubber pad or mat supported on a rigid back-up member (not shown), may consist of various materials. Generally speaking, the pad 11 may comprise any deformable, resilient material or any flexible material backed by a deformable, resilient material which is capable of withstanding the rigors of a particular bonding operation and which will neither adversely affect the bonding material being employed not the elements being bonded. Depending upon the particular bonding operation, other characteristics or attributes of the pad 11 may be highly desirable. For example, it may be desirable that the pad possess an ability to resist being wetted by the bonding material so as to avoid the possibility of bonding the elements to the pad. Among other characteristics of the pad 11 which may be desirable for a particular operation are an ability to resist detrimental chemical or physical reactions with the bonding material or the elements being bonded, an ability to yield upon the application of pressure thereon so as to substantially conform with the surfaces in pressure engagement therewith, an ability to resist deformation coupled with the tendency to restore to its initial shape and dimensions and an ability to retain the above properties at various temperatures and under various conditions as dictated by the particular bonding material being employed.

Figure 2:
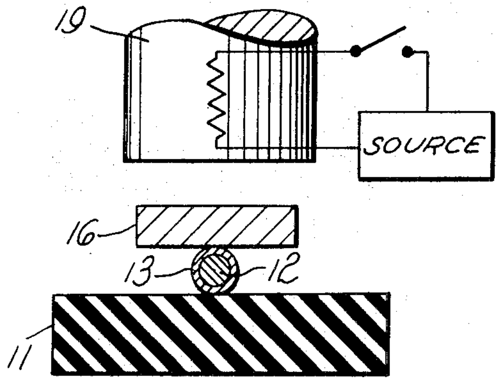
FIG. 2 is a sectional, side view of the elements and bonding means shown in FIG. 1, taken along line 2—2 thereof.
Figure 3:
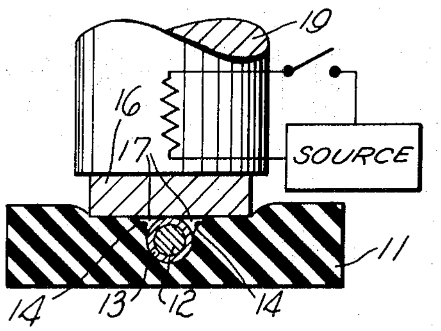
FIGS. 3, 4, and 5 are sectional, side views of the elements and bonding means shown in FIG 1 illustrating, respectively, the manner in which the elements are pressed into engagement with each other, the manner in which the bonding material is forced toward the juncture of the elements, and the manner in which the elements are bonded together after removal from the bonding means.
Figure 4:
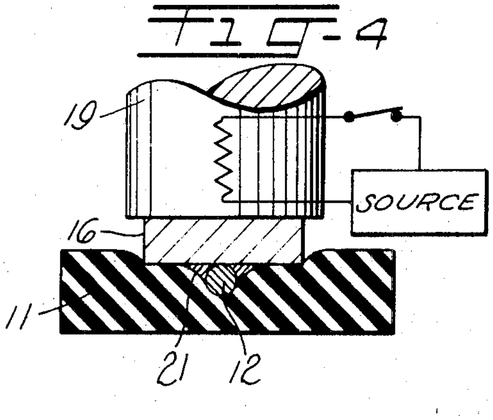
Figure 5:
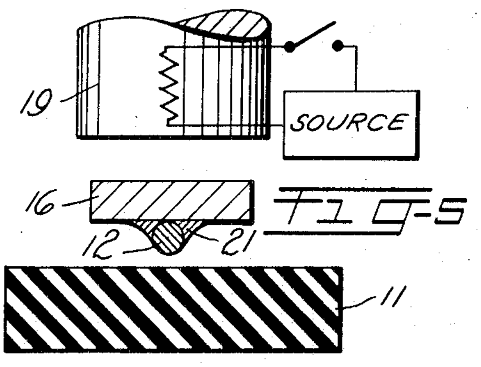

The deformable, resilient nature of the pad 11 is illustrated in FIG. 3 wherein a silicone rubber pad is shown yielding upon the application of pressure on a wire 12 having a solder 13 coating thereon, the wire being positioned on the pad. The nature of the pad 11 is further illustrated in FIGS. 4 and 5 wherein the pad is shown after it has partially returned to its initial dimensions and after it has fully returned to its initial dimensions, respectively. As illustrated in FIG. 3, the pad 11 yields upon the application of pressure so as to form a depression having convexly curved surfaces 14 on each side of the coated wire 12 and so as to substantially conform with the surfaces of the coated wire and a terminal lug 16 in pressure engagement with the pad. The convexly curved surfaces 14 of the depression, in conjunction with the surfaces of the lug 16 and of the coated wire 12, define a fillet-shaped opening 17, the importance of which is discussed below. It will be appreciated that the silicone rubber pad 11 depicted in FIGS. 2–5 may be replaced by a thin sheet of a flexible polymeric compound backed by silicone rubber, or by any other material having the requisite properties as discussed above. Additionally, the depth of the depression in the pad 11, the radii of curvature of the convex portions thereof, and the size of the fillet-shaped opening 17, may be varied depending upon the pressure applied on the pad, the thickness, deformability, and resiliency of the pad, and the rigidity of the back-up member on which the pad is supported (providing such member is employed).

The above-described characteristics of the deformable, resilient pad 11 embody certain principles of the method of the present invention which may be illustrated by an embodiment wherein two workpieces, wire 12 and lug 16, are solder bonded together. One such illustrative embodiment may include the steps of (1) sandwiching a wire and a quantity of solder (which may be coated on the wire) between the deformable, resilient pad and a lug, (2) pressing the sandwiched wire, lug, solder and pad together to depress the pad so that its surface substantially conforms with the surfaces of the wire, lug and solder in pressure engagement therewith, (3) heating to melt the solder whereupon the pad, in resisting deformation, wipes or forces the molten solder toward the juncture of the wire and the lug, and (4) cooling to rigidify the solder and thereby form an electrically conductive bond between the wire and the lug.

Although the above-described illustrative embodiment refers to a method of solder bonding a wire 12 to a lug 16, the present invention is not so limited and, virtually any element may be bonded to any other element by practicing this invention. Additionally, the present invention is in no way limited to the use of a conductive bonding material and the principles embodied in this invention have numerous applications wherein the conductivity of the bonding material is of little or no consequence. It will also be appreciated that the above-discussed step 3 is unnecessary if the bonding material being employed is introduced between the wire 12 and the lug 16 while in a molten state.

Figure 1:
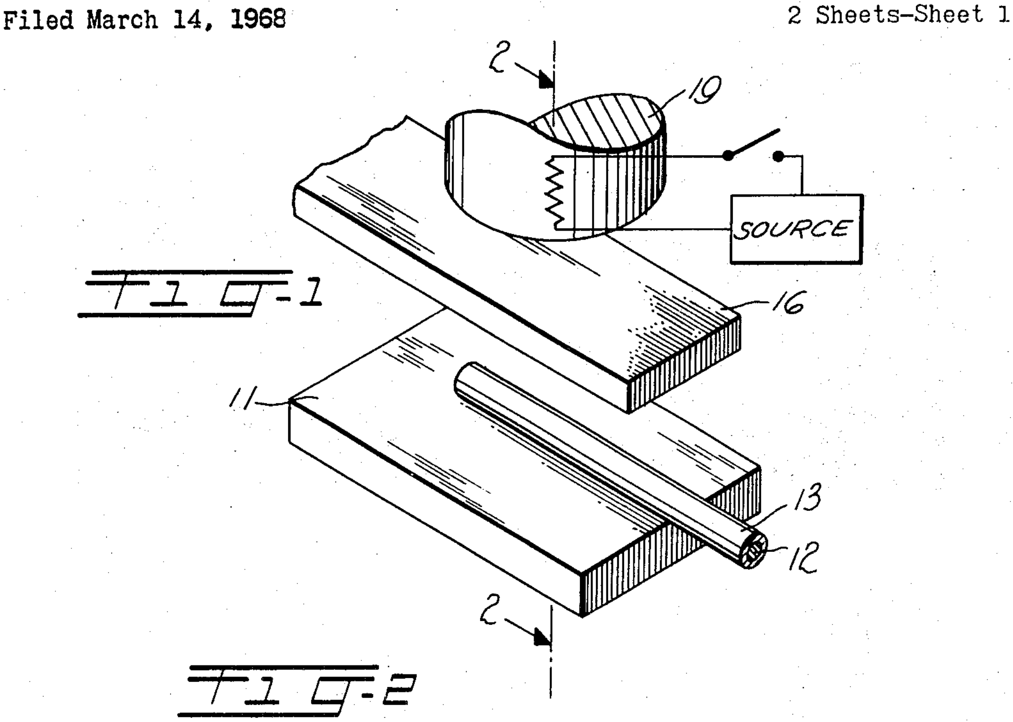
FIG. 1 is a fragmentary, perspective view of a first element having a bonding material precoated thereon and a second element, the elements being positioned between means for bonding the first element to the second element.

Referring to FIG. 1, there is shown wire 12 having a holder 13 coating thereon, the wire being interposed between a terminal lug 16 and a deformable, resilient pad 11. The wire 12 is shown to be disposed parallel to the length of the pad 11, but the characteristics of the pad are such that it will deform at any point in proportion to the pressure applied thereat, thus permitting various orientations of the wire 12 and the lug 16. Additionally, a plurality of wires having various orientations may be simultaneously bonded to a lug 16 (or to a plurality of lugs) without having to first position or align the wires and the lug in a particular orientation with respect to the pad 11.

Figure 6:
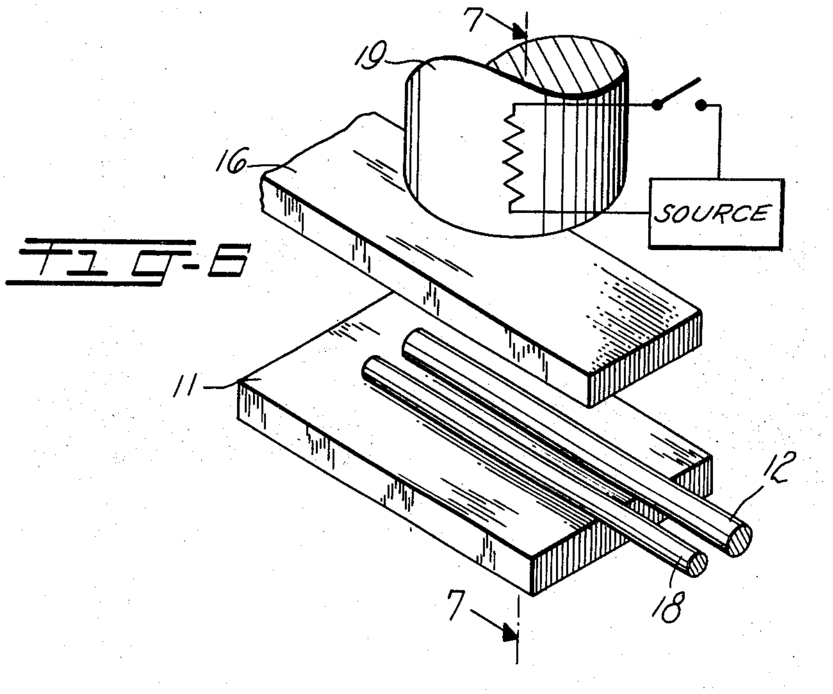
FIG. 6 is a fragmentary, perspective view of a first element, a preform of bonding material, and a second element, the elements and preform being positioned between means for bonding the first element to the second element.
Figure 7:
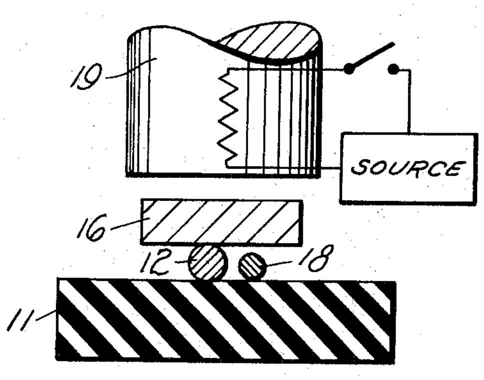
FIG. 7 is a sectional, side view of the elements, bonding material, and means shown in FIG. 6, taken along line 7—7 thereof.
Figure 8:
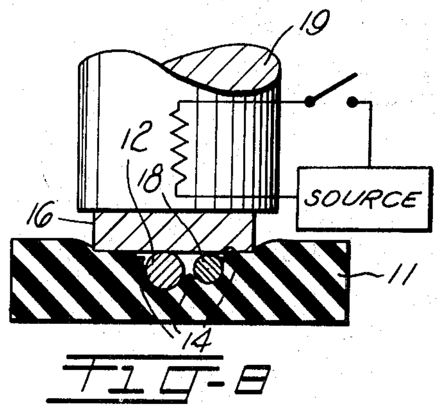
FIGS. 8, 9, and 10 are sectional, side views of the elements, bonding material, and bonding means shown in FIG. 6 illustrating, respectively, the manner in which the elements are pressed into engagement with each other, the manner in which the bonding material is forced toward the juuncture of the elements, and the manner in which the elements are bonded together after removal from the bonding means.

In addition to the above-described variations in the manner in which the wire 12, the lug 16 and the pad 11 may be sandwiched together, the technique employed to incorporate the solder 13 into the sandwich is equally variable. Although, as depicted in FIGS. 1–3, the solder 13 is preferably precoated on the wire 12, a preform 18 or solder may be positioned on or alongside the wire as illustrated in FIGS. 6–8. In addition, a quantity or mass of molten solder may be placed on or alongside the wire 12 and/or the lug 16 (not shown) or, any other suitable means for introducing the solder 13 into the sandwich may be employed.

As illustrated in FIGS. 2–5 and 7–10, the wire 12 and a portion of the lug 16 may be forced into pressure engagement with the pad 11 by applying a force on the lug 16 with the aid of a suitable ram 19. The requisite characteristics of the ram 19 depend upon the particular bonding operation involved and when solder bonding a wire to a lug, it is desirable that the ram 19 have an ability to resist being wetted by molten solder. Generally speaking, the function of the ram 19 is to force the wire 12 against the pad 11 and thereby form a depression in the pad having convexly curved surfaces 14 on either side of the pressure engaged surface of the wire. However, when a heat softenable material, such as solder (or any other bonding material having a fluent state at a first temperature and a rigid state at a second temperature) is to be employed as the bonding material, the ram 19 may assume an added importance, as discussed below. In this regard, if the bonding material, whether or not it be of the heat softenable type, is introduced into the sandwich in its fluent state, the ram 19 is used to depress the pad 11 in conformance with the pressure engaged surfaces of the wire 12 and the lug 16. However, when solder 13 or some other heat softenable bonding material is introduced into the sandwich in its rigid state, the ram 19 may be used as the means for heating and thereby transforming the heat softenable material into its fluent state, and as the means for pressing the wire 12 and lug 16 into engagement with the pad 11. For example, the ram 19 may be preheated before it is forced against the lug 16, or, more preferably, the ram may be heated during the application of pressure on the lug in any suitable manner, such as by passing a pulse of electric current through a resistance heater associated with the ram (see FIGS. 1–10). Preheating the ram 19 and resistance heating the ram during or after the wire 12, lug 16 and pad 11 have been pressed together are not the only means contemplated by the present method for transforming solder or other heat softenable bonding material from its rigid to its fluent state. Alternatively, the lug 16, the wire 12 and/or the solder 13 itself may be heated by any suitable means capable or supplying sufficient heat to render the solder fluent so that the solder is able to flow and to wet the surfaces of the wire 12 and the lug 16.

Figure 9:
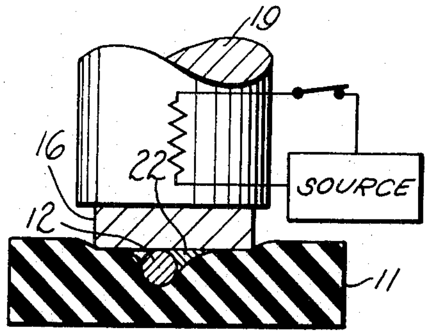
Figure 10:
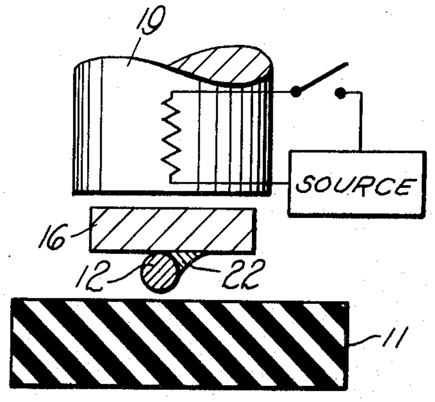

After the solder 13 is in its fluent state, whether by transformation or by virtue of its being introduced into the sandwich in its fluent state, the pad 11, in resisting the deformation caused therein by the wire 12 and the lug 16 in pressure engagement therewith, wipes the fluent solder around the wire and forces it to collect in a fillet-shaped mass 21 at the juncture of the wire and the lug. The pad 11, in resisting deformation, wipes the fluent solder 13 from and around the wire 12 only when the wire is initially precoated as depicted in FIG. 1. When the solder is separately introduced into the sandwich, such as when a preform 18 is employed (see FIG. 7), the pad 11 does not wipe the solder from and around the wire 12, but rather, confines and forces the solder to collect in a fillet-shaped mass 22 as illustrated in FIG. 9. Although, as illustrated in FIGS. 3, 4, 8, and 9, the lug 16 may be in pressure engagement with the pad 11, such pressure engagement is not necessary so long as the wire 12 depresses the pad 11 in the above-described manner and so long as the absence of such pad-lug engagement will not permit the fluent solder 13 to escape or run out from between the lug and the pad. However, this is of little practical importance since in most instances the lug 16, as well as the wire 12, will normally engage the pad 11. Since the pad 11 partially returns to its initial shape as it forces the fluent solder 13 to collect at the juncture of the wire 12 and the lug 16, the configuration of the fillet-shaped mass 21 (see FIG. 4) is different from that of the initial fillet-shaped opening 17 (see FIG. 3). Thus, by properly selecting a pad having suitable characteristics and a solder having suitable wetting and flowing qualities, and by accurately controlling the applied pressure and temperature, the extent to which the pad will deform and the resultant fillet-shape assumed by the fluent mass may be controlled.

After the fluent solder 13 is forced to collect in a fillet-shaped mass 21, the solder is cooled and thereby transformed into its rigid state. When a bonding material which is not of the heat softenable type is employed, transformation of the material into its rigid state may require the addition of a catalyst, a curing agent, or merely the passage of time. However, in the practice of the present invention, it is preferable to employ solder or some other heat softenable type of bonding material which becomes fluent at a first temperature and rigid at a second temperature. Therefore, in order to accomplish the transformation of the solder 13 from its fluent into its rigid state, the solder need merely be cooled to a temperature at which the solder is rigid. The manner in which the solder 13 is cooled and thus rigidified is not critical. It is preferred that the ram 19, the wire 12, and/or the lug 16 posses a sufficiently large mass and/or a sufficiently high coefficient of thermal conductivity to act as a heat sink, but, practically speaking, any means capable of cooling and thereby rigidifying the solder may be employed.

Regardless of the means employed to transform the solder 13 into its rigid state, the resulting fillet-shaped bond may be visually inspected (i.e., a visual inspection may reveal a discontinuity in the fillet indicating a potential mechanical or electrical defect). Additionally, since a fillet-shaped bond contacts relatively large areas of the wire 12 and the lug 16 and has a concave surface, such a bond tends to maximize the ratio of the strength of the bond to the mass of solder comprising the bond. Also, since the bond site is substantially protected from the atmosphere by the pad 11 and the lug 16 in pressure engagement with the wire 12, a fillet-shaped bond formed by the practice of the present invention is virtually free from oxidation products and other similar defects caused by exposure of the bond site to the atmosphere during bonding. Additionally, a solder bond formed in accordance with the present invention avoids the necessity of employing a fluxing material which may add to the cost of each bond and which may corrode or otherwise adversely affect the bonding means being employed.

The term "fluent state" as used in this specification and claims is meant to describe a state wherein a material in such state may be caused to flow or deform by a force exerted on such material by a deformable, resilient pad in opposing deformation. The term includes a material in a liquid state and also includes particulate materials and solid materials which may be caused to deform or flow under the above-described force.

The term "rigid state" as used in this specification and claims is meant to describe a state wherein a material in such state is non-fluent and wherein the material is sufficiently strong to effect a desired bond.

Several examples of methods in accordance with this invention are described in deail below.

EXAMPLE 1

Eighteen 24 AWG tin-copper wires having a 250 microinch coating of 60–40 lead-tin solder thereon were placed on a steel-backed, ¼ inch thick neoprene pad. A 30 mil thick aluminum oxide circuit panel having eighteen 10,000 A. thick gold terminal pads thereon was placed on the wires so that each terminal pad contacted a separate wire. A tungsten rod, ⅜ inches square, heated to a temperature of 900° F., was pressed against the aluminum oxide panel with a force of 20 pounds for ½ second to force the wires into the neoprene pad and to melt the solder on the wires. The heated rod was removed from the circuit panel to allow the molten solder to cool and solidify, Upon inspection, eighteen uniform, mechanically strong fillet-shaped solder bonds affording dependable electrical connections were observed.

EXAMPLE 2

An 18 AWG tin-copper wire having a 250 microinch coating of tin thereon was placed on a steelbacked ¼ inch thick silicone rubber pad. A ¼ inch by ½ inch by 15 mill gold terminal lub having 10,000 A. thick tin coating thereon was placed on the tin-coated wire. A tungsten rod, ⅜ inch square, heated to a temperature of 1,000° F., was pressed on the lug with a force of 15 pounds for 1 second to depress the wire into the silicone rubber pad and to melt the tin coated on the wire and the lug. The heated rod was removed from the gold lug whereupon the molten tin cooled and solidified. Upon inspection, a mechanically strong, fillet-shaped bond affording a dependable electrical connection was observed.

It is to be understood that the above examples and the above-described illustrative embodiment in no way limit the scope of this invention and are intended merely as illustrations of the manner in which the present invention may be practiced. It should be obvious to one skilled in the art that the present invention is in no way limited to the solder bonding of wires to electrical terminals and that numerous modifications within the spirit and scope of this invention are contemplated.

What is claimed is:

1. A method of bonding a precoated wire to a workpiece wherein the material coated on the wire has a fluent state at a first temperature and a rigid state at a second temperature, which method comprises the steps of:

placing the precoated wire on a deformable, resilient pad intermediate the pad and a workpiece, said pad having the ability to maintain its deformable and resilient properties at said first and said second temperatures;

pressing the wire, pad, and workpiece together while said material is in said rigid state to deform said pad in conformance with the surfaces of said coated wire and said workpiece;

heating said material to said first temperature to transform said material into said fluent state, whereupon said pad wipes said material from the pressure engaged surface of said wire and forces said material towards the juncture of said wire and said workpiece; and cooling said material to said second temperature to transform said material into said rigid state to bond said wire to said workpiece.

2. A method as set forth in claim 1 wherein said wire is precoated with material selected from the group consisting of metals and alloys.

3. A method as set forth in claim 1 wherein:

said pressing step comprises pressing an electrically energizable heating ram onto said workpiece;

said heating step comprises passing an electrical pulse through said energizable ram; and said cooling step comprises discontinuing said electrical pulse to cool said ram while maintaining said ram in contact with said workpiece.

4. A method of soldering a first workpiece to a second workpiece, which method comprises the steps of:

interposing the first workpiece between a deformable, resilient pad and the second workpiece;

introducing a quantity of molten solder between the workpieces proximate a prospective bond site;

pressing said first workpiece, second workpiece and pad together to deform said pad in conformance with surfaces of said workpieces in pressure engagement therewith, said pad forcing said molten solder toward the juncture of said first and second workpieces; and cooling to solidify said solder and thereby bond said first workpiece to said second workpiece.

5. A method as set forth in claim 4 in which the quantity of molten solder is introduced between the workpieces by first introducing the solder in a rigid state, and then applying heat to melt the solder.

6. A method of forming a fillet-shaped, solder bond between a wire and a workpiece wherein the wire is precoated with solder, which method comprises:

interposing the solder-coated wire between a workpiece and a deformable, resilient pad, said pad having the ability to resist wetting by said solder;

pressing said wire, workpiece, and pad together while said solder is in a rigid state to press said wire against said pad, said pad yielding under the pressure on said wire to form a depression having a convexly curved surface on each side of said wire, said convexly curved surface, in conjunction with the surface of the solder coating on said wire and the surface of said workpiece, defining a fillet-shaped space on each side of said wire;

heating to render said solder fluent and to initiate a wiping action by said pad, said pad wiping said solder from between said wire and said pad, and forcing said solder to collect in said fillet-shaped space on each side of said wire; and cooling to rigidify said solder and thereby form a fillet-shaped, solder bond between said wire and said workpiece.

7. A method of bonding a first element to a second element, which comprises the steps of:

sandwiching the first element and a material having a fluent state and a rigid state between the second element and a deformable resilient pad, said material initially being in the rigid state;

pressing the sandwiched elements, material, and pad together while said material is being transformed to said fluent state to deform said pad in conformance with the surfaces of said elements in pressure engagement therewith, said pad forcing said material toward the juncture of said first and second elements; and transforming said material back into said rigid state to bond said first element to said second element.

8. A method of bonding a first element to a second element, which comprises the steps of:

coating the first element with a material having a fluent state and a rigid state, said material initially being in the rigid state;

sandwiching said first element between the second element and a deformable, resilient pad;

pressing the sandwiched elements and pad together to transform said material from the rigid state to the fluent state to deform said pad in conformance with the surfaces of said elements, to wipe said material from the pad-engaged, coated surface of said first element, and to force said material toward the juncture of said first and second elements; and transforming said material back into said rigid state to bond said first element to said second elements.

References Cited

UNITED STATES PATENTS

| | | | |
|---|---|---|---|
| 2,326,022 | 8/1943 | Everett | 29—493 X |
| 2,550,512 | 4/1951 | Woolrich | 29—493 |
| 2,941,570 | 6/1960 | Plym | 156—156 |
| 3,100,254 | 8/1963 | Perkins | 29—497.5 X |
| 3,252,203 | 5/1966 | Alberts et al. | 29—497.5 X |
| 3,290,756 | 12/1966 | Dreyer | 29—627 |
| 3,395,439 | 8/1968 | Palfsi et al. | 29—625 X |
| 3,421,212 | 1/1969 | Chabot | 29—493 X |

JOHN F. CAMPBELL, Primary Examiner

R. J. SHORE, Assistant Examiner

U.S. Cl. X.R.

29—493, 497.5; 156—81, 313; 228—50; 269—310